US010625489B2

(12) United States Patent
Hayashi et al.

(10) Patent No.: US 10,625,489 B2
(45) Date of Patent: Apr. 21, 2020

(54) OPTICAL MEMBER AND METHOD FOR PRODUCING OPTICAL MEMBER

(71) Applicant: SHARP KABUSHIKI KAISHA, Sakai, Osaka (JP)

(72) Inventors: Hidekazu Hayashi, Sakai (JP); Tokio Taguchi, Sakai (JP); Nobuaki Yamada, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 161 days.

(21) Appl. No.: 16/066,645

(22) PCT Filed: Dec. 21, 2016

(86) PCT No.: PCT/JP2016/088015
§ 371 (c)(1),
(2) Date: Jun. 27, 2018

(87) PCT Pub. No.: WO2017/115694
PCT Pub. Date: Jul. 6, 2017

(65) Prior Publication Data
US 2019/0016084 A1    Jan. 17, 2019

(30) Foreign Application Priority Data
Dec. 28, 2015 (JP) ................................ 2015-256798

(51) Int. Cl.
*B32B 3/30* (2006.01)
*B32B 27/08* (2006.01)
*B32B 27/30* (2006.01)
*C23C 14/00* (2006.01)
(Continued)

(52) U.S. Cl.
CPC .................. *B32B 3/30* (2013.01); *B32B 7/02* (2013.01); *B32B 27/08* (2013.01); *B32B 27/308* (2013.01);
(Continued)

(58) Field of Classification Search
CPC ........... B32B 3/30; B32B 7/02; B32B 27/308; B32B 27/08; B32B 2307/754;
(Continued)

(56) References Cited

U.S. PATENT DOCUMENTS

2004/0067339 A1* 4/2004 Gandon ............ B32B 17/10761
428/141
2006/0115623 A1* 6/2006 Aizenberg ............... B05D 5/04
428/141
(Continued)

FOREIGN PATENT DOCUMENTS

JP       2000-308603 A    11/2000
JP       2003-172808 A     6/2003
(Continued)

*Primary Examiner* — Nancy R Johnson
(74) *Attorney, Agent, or Firm* — ScienBiziP, P.C.

(57) ABSTRACT

The present invention provides an optical member excellent in antifouling properties, rubbing resistance, and antifog properties. The optical member of the present invention includes, on a surface thereof, an uneven structure provided with multiple projections at a pitch not longer than a wavelength of visible light, the projections each including a hydrophilic portion at its tip. Preferably, each of the projections is formed from a hydrophobic resin and has its tip covered with a hydrophilic material, the hydrophilic material contains silicon dioxide, and the hydrophilic material has a thickness of 30 nm or smaller.

7 Claims, 5 Drawing Sheets

(51) Int. Cl.
*C23C 14/10* (2006.01)
*C23C 14/34* (2006.01)
*G02B 1/118* (2015.01)
*G02B 1/18* (2015.01)
*B32B 7/02* (2019.01)

(52) U.S. Cl.
CPC .......... *C23C 14/0036* (2013.01); *C23C 14/10* (2013.01); *C23C 14/34* (2013.01); *G02B 1/118* (2013.01); *G02B 1/18* (2015.01); *B32B 2250/02* (2013.01); *B32B 2250/24* (2013.01); *B32B 2255/10* (2013.01); *B32B 2255/20* (2013.01); *B32B 2307/728* (2013.01); *B32B 2307/754* (2013.01)

(58) Field of Classification Search
CPC .......... B32B 2307/728; B32B 2255/20; B32B 2255/10; B32B 2250/24; B32B 2250/02; C23C 14/34; C23C 14/10; C23C 14/0036; G02B 1/18; G02B 1/118
See application file for complete search history.

(56) References Cited

U.S. PATENT DOCUMENTS

| | | | |
|---|---|---|---|
| 2008/0107868 A1* | 5/2008 | Kuroda | G02B 1/118 428/141 |
| 2008/0199659 A1* | 8/2008 | Zhao | C03C 17/28 428/161 |
| 2013/0140744 A1 | 6/2013 | Nakai et al. | |
| 2014/0098422 A1 | 4/2014 | Fukuda et al. | |

FOREIGN PATENT DOCUMENTS

| | | |
|---|---|---|
| JP | 2007-178724 A | 7/2007 |
| JP | 2010-284843 A | 12/2010 |
| JP | 5005114 B2 | 8/2012 |
| JP | 2014-071323 A | 4/2014 |
| JP | 2014-153524 A | 8/2014 |
| WO | 2012/133946 A1 | 10/2012 |

* cited by examiner (a)

(b)

(c)

(d)

(e)

(a)

(b)

(c)

(d)

OPTICAL MEMBER AND METHOD FOR PRODUCING OPTICAL MEMBER

TECHNICAL FIELD

The present invention relates to optical members and methods for producing optical members. More specifically, the present invention relates to an optical member including on a surface thereof an uneven structure of nanometer scale and a method for producing the optical member.

BACKGROUND ART

Members including a fine uneven structure on a surface thereof are considered to be applied to various uses (for example, Patent Literatures 1 to 5). In particular, optical members including an uneven structure of nanometer scale (nanostructure) on a surface thereof are known for their excellent antireflective properties. This uneven structure has a continuously varying refractive index from the air layer to the substrate, thereby being capable of reducing the reflected light significantly.

CITATION LIST

Patent Literature

Patent Literature 1: JP 2003-172808 A
Patent Literature 2: JP 2007-178724 A
Patent Literature 3: JP 2014-153524 A
Patent Literature 4: JP 5005114 B
Patent Literature 5: JP 2000-308603 A

SUMMARY OF INVENTION

Technical Problem

Conventional optical members, however, are insufficient in antifouling properties, rubbing resistance, and antifog properties, and can still be improved.

Projections formed from a hydrophobic resin can be made highly dirt repellent. Once dirt comes into gaps (recesses) between the projections, however, the projections do not allow wiping of the dirt, especially when the dirt is a liquid component having a low surface tension. For example, in the case of using a wiper to wipe off dirt, the fibers of the wiper have a large diameter and thus have a difficulty in entering the gaps between the projections. The wiper is therefore used in combination with a solvent, but there is another problem that an aqueous solution cannot be used since the projections are formed from a hydrophobic resin. Here, if the projections are formed from a hydrophilic resin, dirt having entered the gaps between the projections spreads easily. The dirt therefore remains there and is likely to be visible because the reflectance of the dirt is significantly different from that of the optical member. Optical members therefore can still be improved in terms of better antifouling properties.

Another possible method to improve the antifouling properties is to apply a fluorine-based material to the surface of the uneven structure, imparting hydrophobicity to the uneven structure. The fluorine-based material, however, has a low degree of adhesion to the uneven structure, and thus is wiped off together with dirt. Optical members therefore can still be improved in terms of better rubbing resistance as well.

In addition, projections formed from a hydrophobic resin show an insufficient rate of spreading water, and can therefore still be improved in terms of better antifog properties.

Patent Literature 1 discloses a configuration in which a water-repellent film made of polytetrafluoroethylene is formed on the surface of an uneven structure. In the invention disclosed in Patent Literature 1, however, the adhesion between the uneven structure and the water-repellent film is low, likely to cause peeling of the water-repellent film. Also, the water-repellent film is thin and thus low in strength, likely to cause a decrease in concentration of polytetrafluoroethylene upon wiping. The uneven structure, being made hydrophobic by such polytetrafluoroethylene, is insufficient in the rate of spreading water. This configuration can therefore still be improved in terms of better rubbing resistance and antifog properties.

Patent Literature 2 discloses a method for forming an uneven structure, including supplying a fluorine compound-containing photo-curable resin composition between a substrate and a die, rolling the composition, and curing the composition. In the invention disclosed in Patent Literature 2, however, the concentration of the fluorine compound on the surface of the uneven structure is insufficient. The uneven structure, being made hydrophobic by such a fluorine compound, is insufficient in the rate of spreading water. This configuration can therefore still be improved in terms of better antifouling properties and antifog properties.

Patent Literature 3 discloses a configuration in which a lubricating layer is formed from a fluorine-based lubricant containing perfluoroalkyl polyethercarboxylic acid on the surface of the uneven structure. In the invention disclosed in Patent Literature 3, however, the adhesion between the uneven structure and the lubricating layer is low, likely to cause peeling of the lubricating layer. The uneven structure, being made hydrophobic by such a fluorine-based lubricant, is insufficient in the rate of spreading water. This configuration can therefore still be improved in terms of better rubbing resistance and antifog properties.

Patent Literature 4 discloses a method for forming an uneven structure, including treating a surface of a die with an external release agent containing fluorine, supplying an active energy ray curable resin composition containing an internal release agent between the die and a substrate, and curing the active energy ray curable resin composition. In the invention disclosed in Patent Literature 4, however, the concentration of the internal release agent on the surface of the uneven structure is insufficient. The uneven structure, being made hydrophobic by such an internal release agent, is insufficient in the rate of spreading water. This configuration can therefore still be improved in terms of better antifouling properties and antifog properties.

Patent Literature 5 discloses a configuration including a streaky, fine uneven structure on a surface thereof. In the invention disclosed in Patent Literature 5, however, dirt having entered the gaps between the projections is difficult to wipe off. Also, the projections (recesses) formed in a streaky pattern causes the uneven structure to be insufficient in the rate of spreading water. This configuration can therefore still be improved in terms of better antifouling properties and antifog properties.

The present invention has been made in view of the above current state of the art, and aims to provide an optical member excellent in antifouling properties, rubbing resistance, and antifog properties, and a method for producing the optical member.

Solution to Problem

The present inventors have made various studies on an optical member excellent in antifouling properties, rubbing resistance, and antifog properties, and have focused on a configuration in which each projection of a nanostructure partially includes a hydrophilic portion. The studies have revealed that a configuration in which each projection includes a hydrophilic portion at its tip can collect dirt at the tips of the projections and make wiping easier, achieving excellent antifouling properties. The studies have also found that the high degree of adhesion between the hydrophilic portions and the respective projections leads to excellent rubbing resistance. Moreover, the hydrophilic portion at the tip of each projection increases the rate of spreading water, leading to excellent antifog properties. The inventors have thereby arrived at a solution to the above problems, completing the present invention.

In other words, one aspect of the present invention may be an optical member including, on a surface thereof, an uneven structure provided with multiple projections at a pitch not longer than a wavelength of visible light, the projections each including a hydrophilic portion at its tip.

Another aspect of the present invention may be a method for producing the optical member including forming a film of the hydrophilic material at the tip of each of the projections.

Advantageous Effects of Invention

The present invention can provide an optical member excellent in antifouling properties, rubbing resistance, and antifog properties, and a method for producing the optical member.

DESCRIPTION OF EMBODIMENTS

The present invention is described in more detail based on the following embodiments with reference to the drawings. The embodiments, however, are not intended to limit the scope of the present invention. The configurations of the embodiments may appropriately be combined or modified within the spirit of the present invention.

Embodiment

Figure 1:
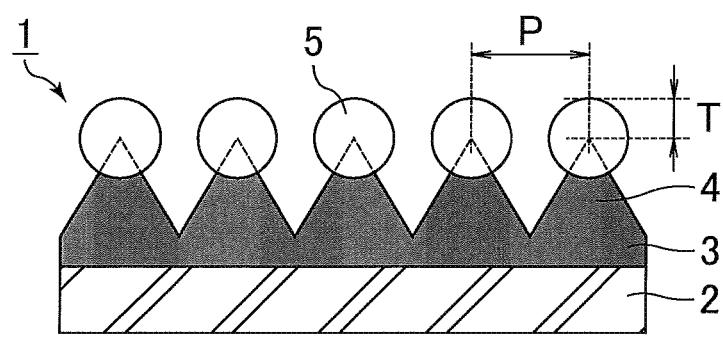
FIG. 1 is a schematic cross-sectional view of an optical member of an embodiment.

FIG. 1 is a schematic cross-sectional view of an optical member of an embodiment. As shown in FIG. 1, an optical member 1 includes a substrate 2, a cured resin layer 3, and a hydrophilic material 5. The cured resin layer 3 includes on the surface thereof an uneven structure provided with multiple projections (protrusions) 4 at a pitch (distance between the apexes of adjacent projections 4) P not longer than a wavelength of visible light. The optical member 1 therefore corresponds to an antireflective member having a moth-eye structure (a structure like a moth's eye). Thus, the optical member 1 can exert excellent antireflective properties (low reflectivity) owing to the moth-eye structure. Each of the tips of the projections 4 is covered with the hydrophilic material 5.

The substrate 2 may be formed from any material such as triacetyl cellulose (TAC), polyethylene terephthalate (PET), or methyl methacrylate (MMA). The substrate 2 may contain appropriate amount(s) of additive(s) such as a plasticizer as well as the above material.

The substrate 2 may have any shape such as a film shape or a sheet shape. In the case of forming the optical member 1 into a film shape, a film-shaped substrate 2 may be used. For example, a film such as a triacetyl cellulose film (TAC film) is preferred. Also, the substrate 2 preferably constitutes a polarizing plate.

The substrate 2 may have any thickness. In order to ensure the transparency and processability, the thickness is preferably 50 µm or greater and 100 µm or smaller.

The projections 4 may have any shape tapering toward the tip (a tapered shape) such as a shape consisting of a columnar lower part and a hemispherical upper part (temple-bell-like shape), and a conical shape (cone-like shape, circular-cone-like shape). The projections 4 may also have a shape with branched protrusions. Branched protrusions mean projections which are disposed at an irregular pitch and formed during anodizing and etching to produce a die for moth-eye structure formation. In FIG. 1, the base between adjacent projections 4 has an inclined shape, but may have a horizontal shape without inclination.

The pitch P between adjacent projections 4 may be any value that is not longer than the wavelength of visible light (780 nm). In order to sufficiently prevent optical phenomena such as moiré and iridescence, the pitch P is preferably 100 nm or greater and 400 nm or smaller, more preferably 100 nm or greater and 200 nm or smaller. The pitch between adjacent projections as used herein is measured with a scanning electron microscope (trade name: S-4700) from Hitachi High-Technologies Corp. and means the average of the distances between two adjacent projections except for branched projections within a 1-µm-square region in a plane image taken by the scanning electron microscope. The pitch between adjacent projections was measured in the state where a film (thickness: 5 nm) of osmium(VIII) oxide from Wako Pure Chemical Industries, Ltd. was formed on the uneven structure using an osmium coater "Neoc-ST" from Meiwafosis Co., Ltd.

The projections 4 may each have any height, but preferably have a height of 50 nm or greater and 600 nm or smaller, more preferably 100 nm or greater and 300 nm or smaller, in order to allow each projection 4 to also have a preferred aspect ratio to be mentioned later. The height of the projections as used herein is measured with a scanning electron microscope (trade name: S-4700) from Hitachi High-Technologies Corp. and means the average of the heights of 10 consecutive projections except for branched projections in a cross-sectional image taken by the scanning electron microscope. The 10 projections are selected so as not to include projections having any defect or deformed portion (e.g., a portion accidentally deformed during preparation of a sample). The sample is taken from a region where the optical member has no specific defect. For example, in the case of an optical member having a roll shape formed by continuous production, a sample is taken from a central region of the roll. The height of the projections was measured in the state where a film (thickness: 5 nm) of osmium (VIII) oxide from Wako Pure Chemical Industries, Ltd. was formed on the uneven structure using an osmium coater "Neoc-ST" from Meiwafosis Co., Ltd.

The projections 4 may each have any aspect ratio, but preferably have an aspect ratio of 0.8 or greater and 1.5 or smaller. With the projections 4 each having an aspect ratio of 1.5 or smaller, the processability of the moth-eye structure is sufficiently high and there is less chance of occurrence of sticking and poor transferring conditions in formation of the moth-eye structure (e.g., clogging of die, twining of the material). When the projections 4 each have an aspect ratio of 0.8 or greater, the optical member can sufficiently prevent occurrence of optical phenomena such as moiré and iridescence, achieving favorable reflection characteristics. The aspect ratio of the projections as used herein is represented by the ratio of the height of the projection of interest and the pitch between adjacent projections measured as described above (height/pitch) with a scanning electron microscope (trade name: S-4700) from Hitachi High-Technologies Corp.

The projections 4 may be arranged in any manner, and may be arranged either randomly or regularly. In order to sufficiently prevent occurrence of moiré, the projections 4 are preferably arranged randomly.

Each of the projections 4 is formed from a hydrophobic resin and has its tip covered with the hydrophilic material 5. Each projection 4 therefore includes a hydrophilic portion (tip) covered with the hydrophilic material 5 and a hydrophobic portion where the hydrophobic resin is exposed. The hydrophilic portion as used herein refers to a portion of each projection that has a higher surface tension than portions of the projection other than the tip, preferably a portion that has a contact angle with water of 30° or smaller. The portions of the projection other than the tip preferably have a contact angle with water greater than 90°. The hydrophilic material as used herein refers to a material that has a higher surface tension than the hydrophobic resin constituting the projections, preferably a material that has a contact angle with water of 30° or smaller. The hydrophobic resin preferably has a contact angle with water greater than 90°. The surface tension as used herein is measured by the penetration rate method. The penetration rate method includes pressing the target substance into a column under a constant pressure to fill the column, and determining the surface tension of the target substance from the equation: $h^2/t=(r\cdot\gamma \cos \theta)/2\eta$. In this equation, h represents the penetration height of water, t represents time, r represents the radius of capillary of the filling target substance, γ represents the surface tension, η represents the viscosity of water, and θ represents the contact angle with water. The smaller the surface tension is, the greater the contact angle becomes and the higher the hydrophobicity becomes.

Known examples of the hydrophobic resin include a nanoimprint resin (trade name: NIF-A-1) from Asahi Glass Co., Ltd., a nanoimprint resin (trade name: PAK-02) from Toyo Gosei Co., Ltd., and a nanoimprint resin (trade name: FROMP®) from Mitsui Chemicals, Inc. The hydrophobic resin can also be a cured product of a mixture (the resin composition described below) of a urethane acrylate, a polyfunctional acrylate, a monofunctional monomer, a fluorine-containing compound, and a polymerization initiator, or a stack of such cured products.

Examples of the hydrophilic material 5 include oxides and nitrides, with inorganic oxides and inorganic nitrides preferred. Examples of the inorganic oxides include silicon dioxide ($SiO_2$), indium tin oxide (ITO), and tantalum pentoxide ($Ta_2O_5$). Examples of the inorganic nitrides include silicon nitrides (SiN, $Si_3N_4$). The hydrophilic material 5 preferably contains silicon dioxide.

The hydrophilic material 5 preferably has a thickness of 30 nm or smaller. The hydrophilic material 5 having a thickness of 30 nm or smaller can favorably cover the tip of each projection 4. The thickness of the hydrophilic material as used herein means the distance from the surface of the hydrophilic material close to the apex of a projection to the surface of the hydrophilic material away from the apex of the projection (corresponding to the thickness T in FIG. 1).

As described above, according to the present embodiment, since the tip of each projection 4 is covered with the hydrophilic material 5, the following effects (i) to (iv) can be achieved.

(i) When dirt is attached to the surface of the optical member 1 (surface of the uneven structure), the dirt is attracted to the tips of the projections 4, and is therefore easy to wipe off. Also, in each projection 4, there is a border between the hydrophilic portion (tip) where the projection 4 is covered with the hydrophilic material 5 and the hydrophobic portion where the hydrophobic resin is exposed. This configuration can prevent even a large amount of dirt attached to the uneven structure (e.g., dirt particles having a larger size than the pitch P between adjacent projections 4) from crossing the border and entering the depths of the gaps (recesses) between the projections 4. This effect becomes more significant as the degree of unevenness on the surface at the border is made more significant. The optical member 1 can therefore achieve excellent antifouling properties.

(ii) Even when dirt is attached to the surface of the optical member 1 (surface of the uneven structure), the dirt is less visible since it is dispersed (nanodispersed) among the tips of the projections 4.

(iii) Since the adhesion between the hydrophilic material 5 and the projections 4 is high, the optical member 1 can achieve excellent rubbing resistance.

(iv) Since the hydrophilic material 5 increases the rate of spreading water, the optical member 1 can achieve excellent antifog properties.

Figure 2:
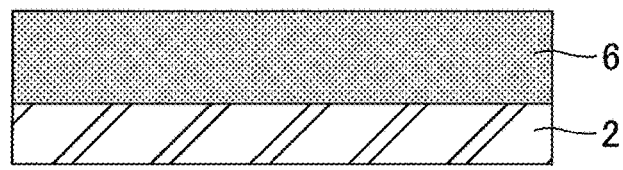
FIG. 2 shows schematic cross-sectional views illustrating a process of producing the optical member of the embodiment (steps a to e).
Figure 2:
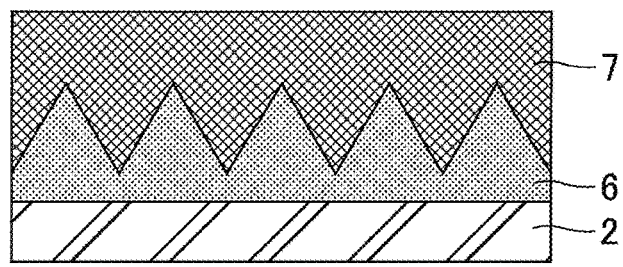
Figure 2:
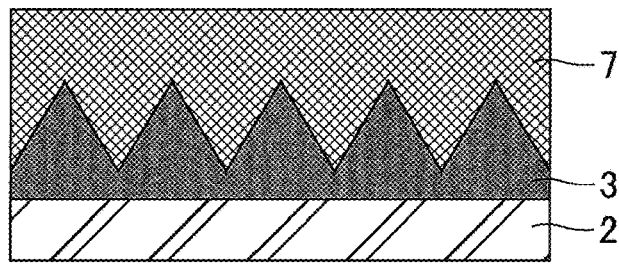
Figure 2:
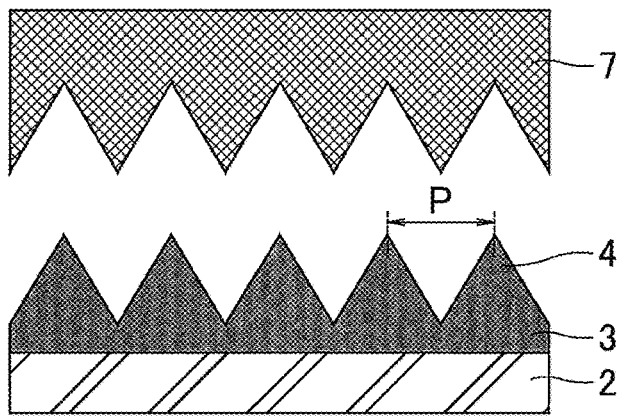
Figure 2:
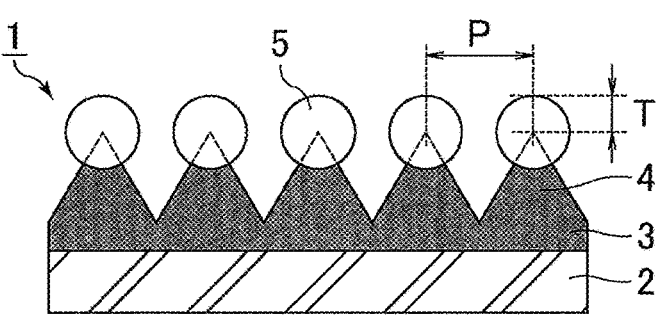

An exemplary process of producing the optical member of the present embodiment is described with reference to FIG. 2. FIG. 2 shows schematic cross-sectional views illustrating a process of producing the optical member of the embodiment (steps a to e).

(a) Application of Resin Composition

As shown in FIG. 2(a), a resin composition 6 is applied to a surface of the substrate 2. The resin composition 6 may be applied by any technique such as spray coating, gravure coating, or slot-die coating.

The resin composition 6 is preferably cured (polymerized) by application of active energy rays. The active energy rays as used herein mean ultraviolet rays, visible light, infrared rays, or plasma, for example. The resin composition 6 is preferably cured by ultraviolet rays.

The resin composition 6 may appropriately contain a compound such as a urethane acrylate, a polyfunctional acrylate, a monofunctional monomer, a fluorine-containing compound, or a polymerization initiator.

Examples of the urethane acrylate include a urethane acrylate (trade name: UA-7100) from Shin Nakamura Chemical Co., Ltd., a urethane acrylate (trade name: U-4HA) from Shin Nakamura Chemical Co., Ltd., a urethane acrylate (trade name: UA-306H) from Kyoeisha Chemical Co., Ltd., and a urethane acrylate (trade name:

AH-600) from Kyoeisha Chemical Co., Ltd. The resin composition 6 may contain one or multiple of the urethane acrylates.

Examples of the polyfunctional acrylate include pentaerythritol triacrylate, ethoxylated pentaerythritol tetraacrylate, 1,6-hexanediol diacrylate, tripropylene glycol diacrylate, and ethoxylated (4-mol adduct of) bisphenol A diacrylate. Known examples of pentaerythritol triacrylate include a polyfunctional acrylate (trade name: A-TMM-3LM-N) from Shin Nakamura Chemical Co., Ltd. Known examples of ethoxylated pentaerythritol tetraacrylate include a polyfunctional acrylate (trade name: ATM-35E) from Shin Nakamura Chemical Co., Ltd. Known examples of 1,6-hexanediol diacrylate include a polyfunctional acrylate (trade name: A-HD-N) from Shin Nakamura Chemical Co., Ltd. Known examples of tripropylene glycol diacrylate include a polyfunctional acrylate (trade name: APG-200) from Shin Nakamura Chemical Co., Ltd. Known examples of ethoxylated (4-mol adduct of) bisphenol A diacrylate include a polyfunctional acrylate (trade name: A-BPE-4) from Shin Nakamura Chemical Co., Ltd. The resin composition 6 may contain one or multiple of the polyfunctional acrylates.

Examples of the monofunctional monomer include N-acryloylmorpholine, N,N-dimethylacrylamide, N,N-diethylacrylamide, N,N-dimethylmethacrylamide, and N-methoxy-N-methyl-3-phenyl-acrylamide. Known examples of N-acryloylmorpholine include a monofunctional monomer (trade name: ACMO®) from KJ Chemicals Corp. Known examples of N,N-dimethylacrylamide include a monofunctional monomer (trade name: DMAA®) from KJ Chemicals Corp. Known examples of N,N-diethylacrylamide include a monofunctional monomer (trade name: DEAA®) from KJ Chemicals Corp. Known examples of N,N-dimethylmethacrylamide include a monofunctional monomer (product code: D0745) from Tokyo Chemical Industry Co., Ltd. Known examples of N-methoxy-N-methyl-3-phenyl-acrylamide include a monofunctional monomer from Sigma-Aldrich Japan. The resin composition 6 may contain one or multiple of the monofunctional monomers. The monofunctional monomer preferably includes at least one monomer selected from the group consisting of N-acryloylmorpholine, N,N-dimethylacrylamide, and N,N-diethylacrylamide.

The fluorine-containing compound contains a fluorine-containing monomer as a constituent component. The fluorine-containing compound may further contain other monomer component(s) such as an acrylate monomer.

The fluorine-containing compound preferably contains a reactive group. The reactive group as used herein means a moiety reactive with another component under external energy such as light or heat. Examples of such a reactive group include an alkoxysilyl group, silyl ether group, silanol group obtained by hydrolysis of an alkoxysilyl group, carboxyl group, hydroxy group, epoxy group, vinyl group, allyl group, acryloyl group, and methacryloyl group. In terms of the reactivity and handleability, the reactive group is preferably an alkoxysilyl, silyl ether, silanol, epoxy, vinyl, allyl, acryloyl, or methacryloyl group, more preferably a vinyl, allyl, acryloyl, or methacryloyl group, still more preferably an acryloyl or methacryloyl group.

The fluorine-containing compound preferably contains, in addition to a reactive group, a moiety containing at least one selected from the group consisting of fluoroalkyl groups, fluorooxyalkyl groups, fluoroalkenyl groups, fluoroalkanediyl groups, and fluorooxyalkanediyl groups. Fluoroalkyl groups, fluorooxyalkyl groups, fluoroalkenyl groups, fluoroalkanediyl groups, and fluorooxyalkanediyl groups are substituents in which at least one of the hydrogen atoms is replaced by a fluorine atom respectively in alkyl groups, oxyalkyl groups, alkenyl groups, alkanediyl groups, and oxyalkanediyl groups. Fluoroalkyl groups, fluorooxyalkyl groups, fluoroalkenyl groups, fluoroalkanediyl groups, and fluorooxyalkanediyl groups are substituents mainly containing fluorine atoms and carbon atoms. The structure of each group may have a branch, and multiple of these substituents may be linked with each other.

An example of the fluorine-containing monomer, which is a constituent component of the fluorine-containing compound, is one represented by the following formula (A):

$$R^{f1}\text{—}R^2\text{—}D^1 \quad (A)$$

wherein $R^{f1}$ is a moiety containing at least one selected from the group consisting of fluoroalkyl groups, fluorooxyalkyl groups, fluoroalkenyl groups, fluoroalkanediyl groups, and fluorooxyalkanediyl groups; $R^2$ is an alkanediyl group, an alkanetriyl group, or an ester, urethane, ether, or triazine structure derived therefrom; and $D^1$ is a reactive group.

Examples of the fluorine-containing monomer represented by the formula (A) include 2,2,2-trifluoroethyl acrylate, 2,2,3,3,3-pentafluoropropyl acrylate, 2-perfluorobutylethyl acrylate, 3-perfluorobutyl-2-hydroxypropyl acrylate, 2-perfluorohexylethyl acrylate, 3-perfluorohexyl-2-hydroxypropyl acrylate, 2-perfluorooctylethyl acrylate, 3-perfluorooctyl-2-hydroxypropyl acrylate, 2-perfluorodecylethyl acrylate, 2-perfluoro-3-methylbutylethyl acrylate, 3-perfluoro-3-methoxybutyl-2-hydroxypropyl acrylate, 2-perfluoro-5-methylhexylethyl acrylate, 3-perfluoro-5-methylhexyl-2-hydroxypropyl acrylate, 2-perfluoro-7-methyloctyl-2-hydroxypropyl acrylate, tetrafluoropropyl acrylate, octafluoropentyl acrylate, dodecafluoroheptyl acrylate, hexadecafluorononyl acrylate, hexafluorobutyl acrylate, 2,2,2-trifluoroethyl methacrylate, 2,2,3,3,3-pentafluoropropyl methacrylate, 2-perfluorobutylethyl methacrylate, 3-perfluorobutyl-2-hydroxypropyl methacrylate, 2-perfluorooctylethyl methacrylate, 3-perfluorooctyl-2-hydroxypropyl methacrylate, 2-perfluorodecylethyl methacrylate, 2-perfluoro-3-methylbutylethyl methacrylate, 3-perfluoro-3-methylbutyl-2-hydroxypropyl methacrylate, 2-perfluoro-5-methylhexylethyl methacrylate, 3-perfluoro-5-methylhexyl-2-hydroxypropyl methacrylate, 2-perfluoro-7-methyloctylethyl methacrylate, 3-perfluoro-7-methyloctylethyl methacrylate, tetrafluoropropyl methacrylate, octafluoropentyl methacrylate, dodecafluoroheptyl methacrylate, hexadecafluorononyl methacrylate, 1-trifluoromethyltrifluoroethyl methacrylate, hexafluorobutyl methacrylate, and triacryloylheptadecafluorononenyl-pentaerythritol.

An example of a material of the fluorine-containing monomer is preferably a material having a fluoropolyether moiety. The fluoropolyether moiety is a moiety containing groups such as a fluoroalkyl group, an oxyfluoroalkyl group, or an oxyfluoroalkyldiyl group, and is a structure typified by the following formula (B) or (C):

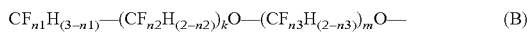

$$CF_{n1}H_{(3-n1)}\text{—}(CF_{n2}H_{(2-n2)})_k O\text{—}(CF_{n3}H_{(2-n3)})_m O\text{—} \quad (B)$$

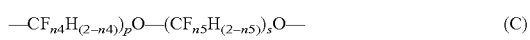

$$\text{—}CF_{n4}H_{(2-n4)})_p O\text{—}(CF_{n5}H_{(2-n5)})_s O\text{—} \quad (C)$$

wherein n1 is an integer of 1 to 3; n2 to n5 are each 1 or 2; and k, m, p, and s are each an integer of 0 or greater. In a preferred combination of n1 to n5, n1 is 2 or 3 and n2 to n5 are each 1 or 2. In a more preferred combination, n1 is 3, n2 and n4 are each 2, and n3 and n5 are each 1 or 2.

The fluoropolyether moiety preferably has a carbon number of 4 or more and 12 or less, more preferably 4 or more and 10 or less, still more preferably 6 or more and 8 or less. If the carbon number is less than 4, the surface energy may unfortunately be low. If the carbon number is more than 12, the solubility in a solvent may unfortunately be low. The fluorine-containing monomer may contain multiple fluoropolyether moieties per molecule.

Known examples of the fluorine-containing compound containing a reactive group include a fluorine-based additive (trade name: Optool® DAC-HP) from Daikin Industries, Ltd., a fluorine-based additive (trade name: Afluid) from Asahi Glass Co., Ltd., a fluorine-based additive (trade name: Megaface® RS-76-NS) from DIC Corp., a fluorine-based additive (trade name: Megaface RS-90) from DIC Corp., a fluorine-based additive (trade name: Ftergent® 601AD) from Neos Co., Ltd., a fluorine-based additive (trade name: C10GACRY) from Yushiseihin Co., Ltd., and a fluorine-based additive (trade name: C8HGOL) from Yushiseihin Co., Ltd. The fluorine-containing compound is preferably one that is polymerizable by ultraviolet rays. The fluorine-containing compound preferably contains one or both of the —$OCF_2$— chain and the =NCO— chain. The resin composition 6 may contain one or multiple of these fluorine-containing compounds.

Examples of the polymerization initiator include a photo-polymerization initiator. The photo-polymerization initiator is active to active energy rays, and is added so as to initiate a polymerization reaction for polymerizing the monomers. Examples of the photo-polymerization initiator include radical polymerization initiators, anionic polymerization initiators, and cationic polymerization initiators. Examples of such a photo-polymerization initiator include acetophenones such as p-tert-butyltrichloroacetophenone, 2,2'-diethoxyacetophenone, and 2-hydroxy-2-methyl-1-phenylpropan-1-one; ketones such as benzophenone, 4,4'-bisdimethylaminobenzophenone, 2-chlorothioxanthone, 2-methylthioxanthone, 2-ethylthioxanthone, and 2-isopropylthioxanthone; benzoin ethers such as benzoin, benzoin methyl ether, benzoin isopropyl ether, and benzoin isobutyl ether; and benzyl ketals such as benzyl dimethyl ketal and hydroxycyclohexyl phenyl ketone. Known examples of the photo-polymerization initiator include a photo-polymerization initiator (trade name: IRGACURE® 819) from BASF SE and a photo-polymerization initiator (trade name: LUCIRIN® TPO) from BASF SE.

The resin composition 6 preferably contains no solvent. In other words, the resin composition 6 is preferably of solvent-free. In the case where the resin composition 6 is of solvent-free, the cost relating to the use of a solvent and environmental load (e.g., bad odor in use) can be reduced. Furthermore, this configuration eliminates the need for a device for drying and removing a solvent, enabling reduction in the cost relating to such a device. In the case where the resin composition 6 contains a solvent, the resin composition 6 has a high degree of volatility and thus may be low in applicability.

(b) Formation of Uneven Structure

As shown in FIG. 2(b), the die 7 is pushed to the surface of the applied resin composition 6 opposite to the substrate 2, whereby the uneven structure is formed on the surface of the resin composition 6 opposite to the substrate 2.

The die 7 may be one produced by the following method. First, a substrate is prepared which includes on a surface of an aluminum substrate a film of silicon dioxide provided as an insulating layer and a film of pure aluminum. Here, the insulating layer and the pure aluminum layer can be continuously formed by rolling the aluminum substrate. Next, the resulting pure aluminum layer formed on the surface of the substrate is repetitively subjected to anodizing and etching. Thereby, a cavity (die 7) of the moth-eye structure can be produced. At this time, the uneven structure of the die 7 can be modified by adjusting the duration of the anodizing and the duration of the etching. Instead of the aluminum substrate, a glass substrate may be used.

The die 7 may have any shape such as a flat plate shape or a roll shape.

The die 7 preferably has undergone release treatment. The release treatment on the die 7 allows the die 7 to be removed easily from the cured resin layer 3 in the step (d) described below. The release treatment is preferably surface treatment using a silane-coupling agent. The silane-coupling agent is preferably a fluorine-based silane-coupling agent.

(c) Curing of Resin Composition

The resin composition 6 on which the uneven structure is formed is cured. As a result, the cured resin layer 3 (hydrophobic resin) as shown in FIG. 2(c) is formed. The resin composition 6 is preferably cured by application of active energy rays. The active energy rays may be applied to the resin composition 6 from the substrate 2 side or from the side opposite to the substrate 2. The application of the active energy rays may be performed any times, and may be performed one time or multiple times.

(d) Release of Die

The die 7 is released from the cured resin layer 3 as shown in FIG. 2(d). The uneven structure formed on the surface of the cured resin layer 3 opposite to the substrate 2 corresponds to a structure provided with multiple projections 4 at a pitch P not longer than a wavelength of visible light, i.e., the moth-eye structure.

(e) Formation of Film of Hydrophilic Material

A film of the hydrophilic material 5 is formed at the tip of each projection 4. As a result, the optical member 1 as shown in FIG. 2(e) is completed. Examples of the method for forming a film of the hydrophilic material 5 include plasma deposition, chemical vapor deposition (CVD), and wet coating, with plasma deposition (physical vapor deposition (PVD)) preferred. Plasma deposition is a method in which a plasma of ions (e.g., inert gas ions) is made to collide with the target (hydrophilic material) to cause the particles constituting the target to come out of the target, so that the particles are deposited on a desired substance. In formation of a film of the hydrophilic material 5, a reactive gas such as oxygen ($O_2$), carbon dioxide ($CO_2$), or nitrogen ($N_2$) may be used.

In the production process described above, the steps (a) to (e) can be performed in a continuous, efficient manner with, for example, the substrate 2 having a roll shape.

Hereinafter, the present invention is described in more detail based on examples and comparative examples. The examples, however, are not intended to limit the scope of the present invention.

EXAMPLE 1

An optical member of Example 1 was produced through the following production process.

(a) Application of Resin Composition

A resin material A was applied to a surface of the substrate 2 with a bar coater (trade name: No. 05) from Daiichi Rika Co., Ltd. Onto the applied resin material A was sprayed a resin material B with an ultrasonic spray fluxer (trade name of nozzle: Vortex) from Sono-Tek Corporation. Thereby, the resin composition 6 including a stack of layers of the resin material A and the resin material B was formed. The resin composition 6 was of solvent-free.

The substrate 2 used was a TAC film (trade name: Fujitack® TD80UL) from Fujifilm Corp. having been subjected to easy adhesion treatment. The substrate 2 had a thickness of 80 μm.

The resin material A used was a mixture of the following materials. The numerical value following each material indicates the concentration of the material in the resin material A. The resin material A had a thickness of 11 μm.

Urethane acrylate (trade name: UA-7100) from Shin Nakamura Chemical Co., Ltd.: 31 wt %
Polyfunctional acrylate (trade name: ATM-35E) from Shin Nakamura Chemical Co., Ltd.: 40 wt %
Polyfunctional acrylate (trade name: A-TMM-3LM-N) from Shin Nakamura Chemical Co., Ltd.: 27.5 wt %
Photo-polymerization initiator (trade name: IRGACURE 819) from BASF SE: 1.5 wt %

The resin material B used was a mixture of the following materials. The numerical value following each material indicates the concentration of the material in the resin material B. The resin material B had a thickness of 2 μm.

Monofunctional monomer (trade name: ACMO) from KJ Chemicals Corp.: 90 wt %
Fluorine-based additive (trade name: Optool DAC-HP) from Daikin Industries, Ltd.: 10 wt %

The "Optool DAC-HP" used as the fluorine-containing compound had a solids concentration of 20 wt %.

(b) Formation of Uneven Structure

The die 7 was pushed to the surface of the applied resin composition 6 opposite to the substrate 2, whereby the uneven structure was formed on the surface of the resin composition 6 opposite to the substrate 2.

The die 7 used was one produced by the following method. First, a film of aluminum was formed on a glass substrate by sputtering. Next, the resulting aluminum layer was repetitively subjected to anodizing and etching. Thereby, an anodizing layer was formed with many fine pores (recesses) (the distance between the bottom points of adjacent pores was not longer than the wavelength of visible light). Specifically, anodizing, etching, anodizing, etching, anodizing, etching, anodizing, etching, and anodizing were performed successively (anodizing: 5 times, etching: 4 times), so that many fine pores (recesses) were formed each tapering toward the inside of the aluminum (each having a tapered shape). As a result, the die 7 having an uneven structure was obtained. In the present example, the conditions for anodizing and etching were as follows.

<Anodizing Conditions>
Electrode (platinum)-sample (aluminum) distance: 150 mm
Treatment liquid: oxalic acid (0.05 mol/L)
Treatment temperature: 5° C.
Treatment duration: 1 minute
Applied Voltage: 80 V
<Etching Conditions>
Treatment liquid: phosphoric acid (8 mol/L)
Treatment temperature: 30° C.
Treatment duration: 20 minutes The die 7 was found to have a pitch between adjacent recesses of 200 nm and a recess depth of 200 to 250 nm by scanning electron microscopic observation. The surface of the die 7 was subjected to release treatment with a fluorine-based additive (trade name: Optool DSX) from Daikin Industries, Ltd. in advance.

(c) Curing of Resin Composition

The resin composition 6 on which the uneven structure was formed was cured by application of ultraviolet rays (dose: 1 J/cm$^2$) from the substrate 2 side with a UV lamp (trade name: LIGHT HANMAR6J6P3) from Fusion UV systems, Inc. Thereby, the cured resin layer 3 (hydrophobic resin) was formed.

(d) Release of Die

Figure 3:
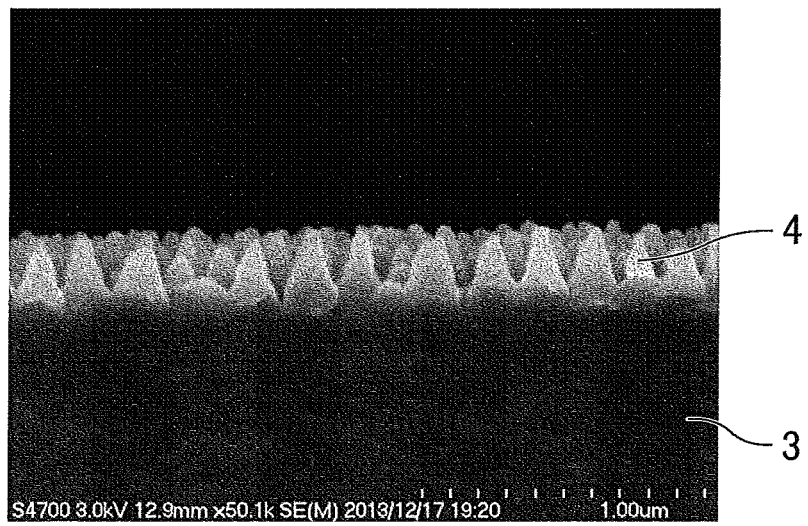
FIG. 3 is a cross-sectional SEM photograph of a cured resin layer in Example 1 upon completion of the layer.

The die 7 was released from the cured resin layer 3. As a result, the state as shown in FIG. 3 was obtained. FIG. 3 is a cross-sectional SEM photograph of a cured resin layer in Example 1 upon completion of the layer.

The specifications of the cured resin layer 3 were as follows.

Figure 4:
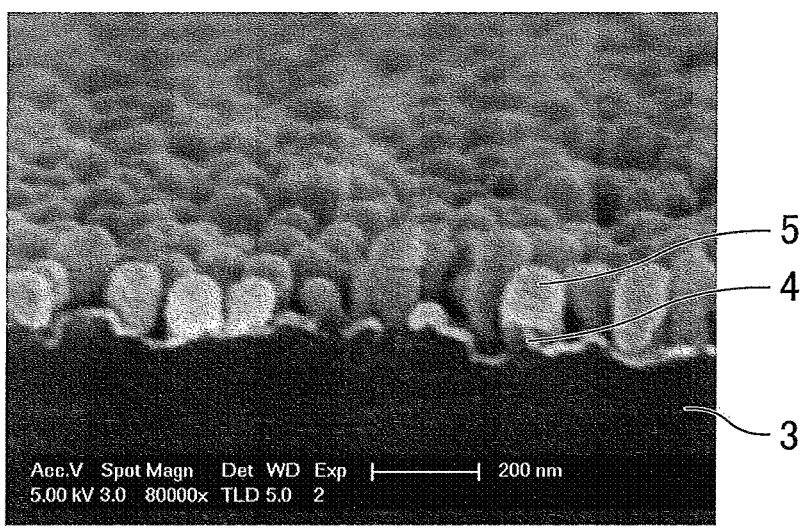
FIG. 4 is a cross-sectional SEM photograph of an optical member of Example 1.

Shape of projection 4: temple-bell-like shape
Pitch P between adjacent projections 4: 200 nm
Height of projection 4: 150 to 200 nm
Surface tension of hydrophobic resin constituting projection 4: 12 dyn/cm (e) Formation of film of hydrophilic material At the tip of each of the projections 4 was formed a film of the hydrophilic material 5 with a plasma deposition sputtering system (trade name: SH-350EL-C06) from Ulvac, Inc. Thereby, the optical member 1 as shown in FIG. 4 was completed. FIG. 4 is a cross-sectional SEM photograph of the optical member of Example 1. In the present example, the conditions for sputtering were as follows.

<Sputtering Conditions>
Power source: RF
Frequency: 13.56 MHz
Background vacuum: 6×10$^{-4}$ Pa
Sputtering gas: argon gas
Reactive gas: oxygen gas
Sputtering vacuum: 4×10$^{-1}$ Pa The hydrophilic material 5 used was silicon dioxide. The hydrophilic material 5 had a thickness of 30 nm. The surface tension of silicon dioxide was 65 dyn/cm, which was higher than the surface tension (12 dyn/cm) of the hydrophobic resin constituting the projections 4.

COMPARATIVE EXAMPLE 1

A non-alkali glass substrate was prepared. The non-alkali glass substrate had a thickness of 0.5 mm.

COMPARATIVE EXAMPLE 2

A non-alkali glass substrate on which an antifog coating material (trade name: oil-film removing/antifog spray CH40) from Rinrei Wax Co., Ltd. was applied was prepared.

COMPARATIVE EXAMPLE 3

Figure 5:
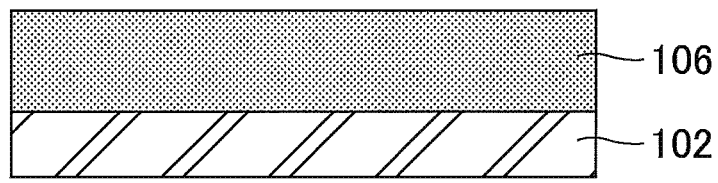
FIG. 5 shows schematic cross-sectional views illustrating a process of producing an optical member of Comparative Example 3 (steps a to d).
Figure 5:
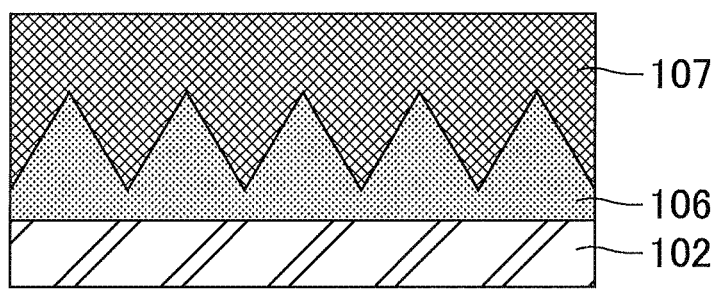
Figure 5:
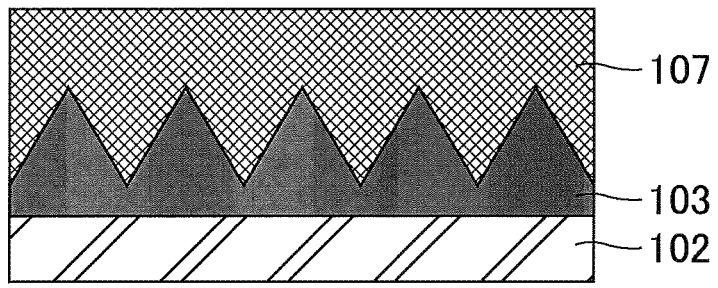
Figure 5:
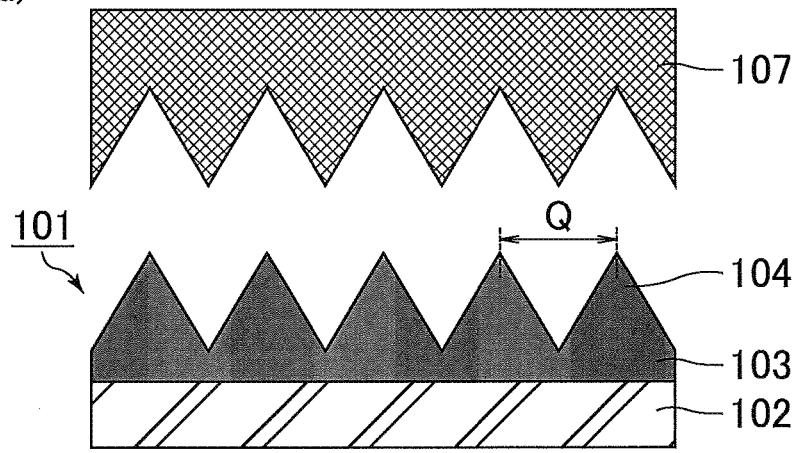

An optical member of Comparative Example 3 was produced by the following production process. FIG. 5 shows schematic cross-sectional views illustrating a process of producing the optical member of Comparative Example 3 (steps a to d).

(a) Application of Resin Composition

As shown in FIG. 5(a), a resin composition 106 was applied to a surface of a substrate 102 with a bar coater (trade name: No. 05) from Daiichi Rika Co., Ltd.

The substrate 102 used was a TAC film (trade name: Fujitack TD60UL) from Fujifilm Corp. The substrate 102 had a thickness of 60 μm.

The resin composition 106 used was a mixture of the following materials. The resin composition 106 had a thickness of 11 μm. The resin composition 106 was of solvent-free.

Polyfunctional acrylate (trade name: A-TMM-3LM-N) from Shin Nakamura Chemical Co., Ltd.: 38.4 parts by weight Polyfunctional acrylate (trade name: ATM-35E) from Shin Nakamura Chemical Co., Ltd.: 25.6 parts by weight Monofunctional monomer (trade name: ACMO) from KJ Chemicals Corp.: 34 parts by weight Fluorine-based additive (trade name: Optool DAC-HP) from Daikin Industries, Ltd.: 0.07 parts by weight Photopolymerization initiator (trade name: LUCIRIN TPO) from BASF SE: 0.5 parts by weight (b) Formation of Uneven Structure As shown in FIG. 5(b), a die 107 was pushed to the surface of the applied resin composition 106 opposite to the substrate 102, whereby the uneven structure was formed on the surface of the resin composition 106 opposite to the substrate 102.

The die 107 used was one produced by the following method. First, a film of aluminum was formed on a glass substrate by sputtering. Next, the resulting aluminum layer was repetitively subjected to anodizing and etching. Thereby, an anodizing layer was formed with many fine pores (recesses) (the distance between the bottom points of adjacent pores was not longer than the wavelength of visible light). Specifically, anodizing, etching, anodizing, etching, anodizing, etching, anodizing, etching, and anodizing were performed successively (anodizing: 5 times, etching: 4 times), so that many fine pores (recesses) were formed each tapering toward the inside of the aluminum (each having a tapered shape). As a result, the die 107 having an uneven structure was obtained. In the present comparative example, the duration of a single anodizing process was 316 seconds, and the duration of a single etching process was 825 seconds. The die 107 was found to have a pitch between adjacent recesses of 100 nm and a recess depth of 200 to 250 nm by scanning electron microscopic observation. The surface of the die 107 was subjected to release treatment with a fluorine-based additive (trade name: Optool DSX) from Daikin Industries, Ltd. in advance.

(c) Curing of Resin Composition

The resin composition 106 on which the uneven structure was formed was cured by application of ultraviolet rays (dose: 1 J/cm$^2$) from the substrate 102 side with a UV lamp (trade name: LIGHT HANMAR6J6P3) from Fusion UV Systems, Inc. Thereby, a cured resin layer 103 as shown in FIG. 5(c) was obtained.

(d) Release of Die

As shown in FIG. 5(d), the die 107 was released from the cured resin layer 103. Thereby, an optical member 101 was completed.

The specifications of the cured resin layer 103 were as follows.

Shape of projection 104: temple-bell-like shape

Pitch Q between adjacent projections 104: 100 nm

Height of projection 104: 150 to 200 nm

COMPARATIVE EXAMPLE 4

An optical member was produced as in Comparative Example 3, except that the pitch Q between adjacent projections 104 was changed to 200 nm.

COMPARATIVE EXAMPLE 5

An optical member was produced as in Comparative Example 3, except that no uneven structure was formed on the cured resin layer 103.

COMPARATIVE EXAMPLE 6

An optical member was produced as in Comparative Example 4, except that the amount of "Optool DAC-HP" used as the fluorine-containing compound in the resin composition 106 in Comparative Example 3 was changed to 1.0 part by weight.

[Evaluation 1]

The antifouling properties in Example 1 and Comparative Examples 1 to 6 were evaluated. The evaluation results are shown in Table 1.

In evaluation of antifouling properties, the sample of each example was evaluated based on whether or not the fingerprints left on a surface of the sample were wiped off. Specifically, fingerprints were left on a surface of the sample of each example, and the sample was left at a temperature of 25° C. and a humidity of 40 to 60% for three days. The surface of the sample of each example was then wiped with a nonwoven fabric (trade name: Savina®) from KB Seiren, Ltd. in a certain one direction 50 times, and whether the fingerprints were wiped off or not was observed under an illuminance of 100 1x. The evaluation indexes used were "good": fingerprints were wiped off completely, "fair": most of the fingerprints were not wiped off, and "poor": the fingerprints were not wiped off at all.

TABLE 1

|  | Antifouling properties |
|---|---|
| Example 1 | Good |
| Comparative Example 1 | Good |
| Comparative Example 2 | Fair |
| Comparative Example 3 | Poor |
| Comparative Example 4 | Poor |
| Comparative Example 5 | Fair |
| Comparative Example 6 | Fair |

As shown in Table 1, the antifouling properties were excellent in Example 1. In Comparative Example 1, the antifouling properties were excellent as in Example 1. In contrast, the antifouling properties in Comparative Example 2, Comparative Example 5, and Comparative Example 6 were inferior to those in Example 1, and the antifouling properties in Comparative Example 3 and Comparative Example 4 were more inferior to those in Example 1.

[Evaluation 2]

The rubbing resistance in Example 1 and Comparative Examples 1 to 6 was evaluated. The evaluation results are shown in Table 2.

The rubbing resistance was evaluated based on a change in contact angle with water of the sample of each example between before and after wiping the sample with a damp fabric. In other words, whether or not the layer (e.g., hydrophilic material 5 in Example 1) formed on the surface of the sample of each example was wiped off was determined based on a change in contact angle with water between before and after wiping the sample of each example with a damp fabric. Specifically, first, the contact angle with water of the surface of the sample of each example was measured. The surface of the sample of each example was then wiped 20 times with an unwoven fabric (trade name: Savina®) from KB Seiren, Ltd. which was damp with water. The contact angle with water of the surface of the sample of each example was measured again. The evaluation criteria were "good": the change in contact angle with water between before and after wiping with a damp fabric was smaller than 1°, and "poor": the change in contact angle with water between before and after wiping with a damp fabric was 1° or greater. The contact angle was the average of contact angles at three sites each calculated by the θ/2 method (calculated from the equation θ/2=arctan(h/r) wherein θ represents a contact angle, r represents the radius of a droplet, and h represents the height of the droplet) using a portable angle meter (product name: PCA-1) from Kyowa Interface Science Co., Ltd. Here, the first measurement site selected was the center portion of the sample of each example, and the second and third measurement sites selected were two points that were away from the first measurement site by 20 mm or more and were symmetrical with the first measurement site.

TABLE 2

| | Rubbing resistance | | |
|---|---|---|---|
| | Contact angle with water (°) | | |
| | Before wiping with damp fabric | After wiping with damp fabric | Evaluation |
| Example 1 | 14.5 | 14.8 | Good |
| Comparative Example 1 | 42.4 | 41.5 | Good |
| Comparative Example 2 | 6.8 | 36.5 | Poor |
| Comparative Example 3 | 6.5 | 15 | Poor |
| Comparative Example 4 | 6.3 | 6.8 | Good |
| Comparative Example 5 | 10.5 | 10.8 | Good |
| Comparative Example 6 | 15.1 | 15.5 | Good |

As shown in Table 2, the rubbing resistance was excellent in Example 1. Also, in Comparative Example 1, Comparative Example 4, Comparative Example 5, and Comparative Example 6, the rubbing resistance was excellent. In contrast, in Comparative Example 2 and Comparative Example 3, the rubbing resistance was poor.

[Evaluation 3]

The antifog properties in Example 1 and Comparative Examples 1 to 6 were evaluated. The evaluation results are shown in Tables 3, 4, and 5.

Figure 6:
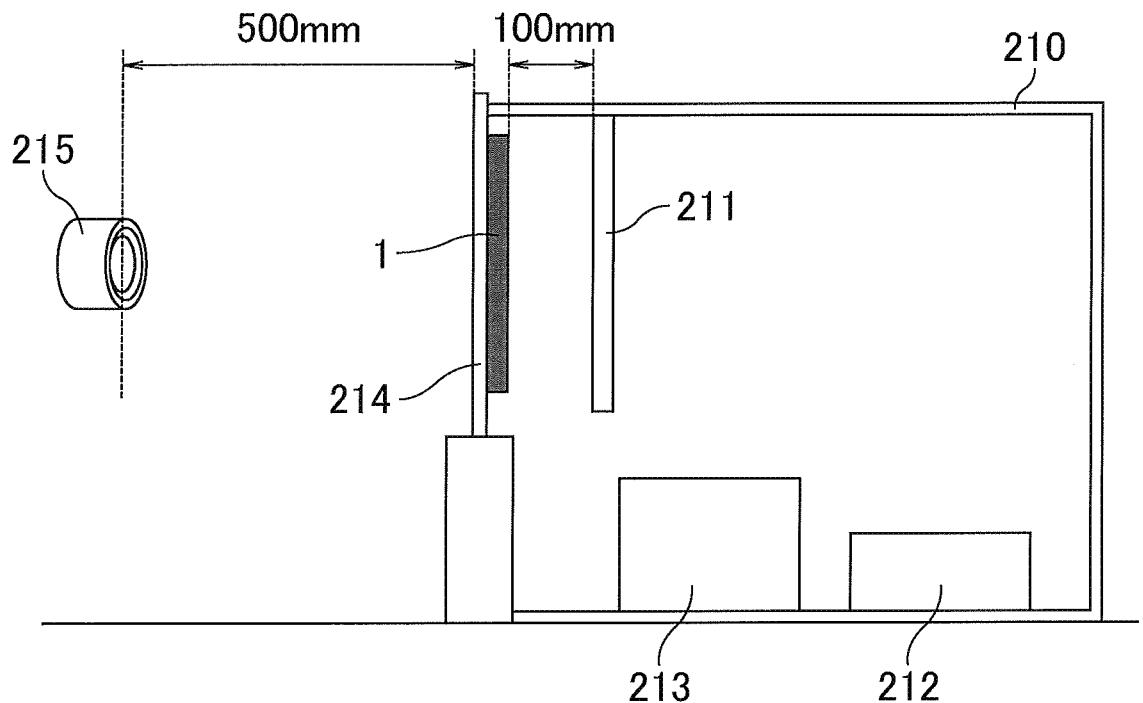
FIG. 6 is a schematic cross-sectional view illustrating the method for evaluating antifog properties.

The antifog properties were evaluated based on the degree of fogging of the sample of each example. The method for evaluating the antifog properties is described below with reference to FIG. 6. FIG. 6 is a schematic cross-sectional view illustrating the method for evaluating antifog properties.

In an acrylic box 210, a piece of paper 211, a heater 212, and a humidifier 213 were placed. The acrylic box 210 (length: 400 mm, width: 300 mm, height: 350 mm) used had a glass substrate 214 (thickness: 0.7 mm) as one of its faces. To part of the surface of the glass substrate 214 close to the piece of paper 211 was attached the sample of each example with an adhesive (trade name: PDS1) from Panac Co., Ltd. FIG. 6 shows an exemplary state where the optical member 1 of Example 1 was attached. The optical member 1 was placed such that the cured resin layer 3 (uneven structure) faced the piece of paper 211. This state was the same in other examples. For example, in Comparative Example 2, the sample was placed such that the surface with an antifog agent applied thereto faced the piece of paper 211. In Comparative Example 3, the sample (optical member 101) was placed such that the cured resin layer 103 faced the piece of paper 211. The sample of each example and the piece of paper 211 were placed such that the distance between their surfaces facing each other was 100 mm.

The heater 212 and the humidifier 213 were activated to measure the temperature, humidity, and dew point in the acrylic box 210 and the temperature of the surface of the glass substrate 214 close to the piece of paper 211 (hereinafter, the temperature is also referred to simply as a "glass surface temperature"). Here, the outputs of the heater 212 and the humidifier 213 were adjusted such that the dew point was higher than the glass surface temperature by about 1° C. to 3° C. Thereby, the humidity in the vicinity of the glass substrate 214 (sample of each example) was about 110%. The temperature and the humidity outside the acrylic box 210 were 24.9° C. and 23.4%, respectively.

In the environment described above, the piece of paper 211 was photographed through the sample of each example from the outside of the acrylic box 210 with a camera 215. The distance between the camera 215 and the surface of the glass substrate 214 opposite to the piece of paper 211 was 500 mm. On the surface of the piece of paper 211 close to the glass substrate 214, six circles (dots) with diameters of 0.5 mm, 1.0 mm, 1.5 mm, 2.0 mm, 2.5 mm, and 3.0 mm were drawn with a pen. At every given time, whether any of the circles was not photographed (was invisible) was determined, and the size(s) of the invisible circle(s) was/were determined. In the results shown in Tables 3 to 5, a numerical value "X" under the column heading "Antifog properties" means that circle(s) with a diameter of X mm or smaller was/were not photographed (was/were invisible). In other words, a greater value of "X" means a higher degree of fogging of the sample of each example. The determination criteria were as follows.

Good: The value of X in the evaluation was 0, which means that every circle was photographed.

Fair: The maximum value of X in the evaluation was 0.5 or greater and 1.5 or smaller.

Poor: The maximum value of X in the evaluation was 2.0 or greater and 3.0 or smaller.

TABLE 3

| | Environment | | | | Antifog properties | | | |
|---|---|---|---|---|---|---|---|---|
| | | | | | Example 1 | | Comparative Example 1 | |
| Elapsed time (min) | Temperature (° C.) | Humidity (%) | Dew point (° C.) | Glass surface temperature (° C.) | Result | Evaluation | Result | Evaluation |
| 0 | 31.4 | 91 | 31.4 | 28.9 | 0.0 | Good | 0.0 | Poor |
| 2 | 31.4 | 98 | 31.4 | 29.1 | 0.0 | | 0.5 | |
| 4 | 31.7 | 100 | 31.7 | 29.5 | 0.0 | | 0.5 | |

TABLE 3-continued

| | Environment | | | | Antifog properties | | | |
|---|---|---|---|---|---|---|---|---|
| Elapsed time | Temperature | Humidity | Dew point | Glass surface temperature | Example 1 | | Comparative Example 1 | |
| (min) | (° C.) | (%) | (° C.) | (° C.) | Result | Evaluation | Result | Evaluation |
| 6 | 32.2 | 100 | 32.2 | 30.6 | 0.0 | | 1.0 | |
| 10 | 32.4 | 100 | 32.4 | 30.2 | 0.0 | | 1.0 | |
| 12 | 32.4 | 99 | 32.4 | 30.1 | 0.0 | | 1.5 | |
| 16 | 32.8 | 99 | 32.8 | 30.4 | 0.0 | | 1.5 | |
| 20 | 33.1 | 93 | 31.7 | 30.7 | 0.0 | | 2.0 | |
| 24 | 33.3 | 92 | 31.8 | 30.8 | 0.0 | | 2.5 | |

TABLE 4

| | Environment | | | | Antifog properties | | | |
|---|---|---|---|---|---|---|---|---|
| Elapsed time | Temperature | Humidity | Dew point | Glass surface temperature | Comparative Example 2 | | Comparative Example 3 | |
| (min) | (° C.) | (%) | (° C.) | (° C.) | Result | Evaluation | Result | Evaluation |
| 0 | 31.4 | 91 | 31.4 | 28.9 | 0.0 | Good | 0.0 | Good |
| 2 | 31.4 | 98 | 31.4 | 29.1 | 0.0 | | 0.0 | |
| 4 | 31.7 | 100 | 31.7 | 29.5 | 0.0 | | 0.0 | |
| 6 | 32.2 | 100 | 32.2 | 30.6 | 0.0 | | 0.0 | |
| 10 | 32.4 | 100 | 32.4 | 30.2 | 0.0 | | 0.0 | |
| 12 | 32.4 | 99 | 32.4 | 30.1 | 0.0 | | 0.0 | |
| 16 | 32.8 | 99 | 32.8 | 30.4 | 0.0 | | 0.0 | |
| 20 | 33.1 | 93 | 31.7 | 30.7 | 0.0 | | 0.0 | |
| 24 | 33.3 | 92 | 31.8 | 30.8 | 0.0 | | 0.0 | |

TABLE 5

| | Environment | | | | Antifog properties | | | | | |
|---|---|---|---|---|---|---|---|---|---|---|
| Elapsed time | Temperature | Humidity | Dew point | Glass surface temperature | Comparative Example 4 | | Comparative Example 5 | | Comparative Example 6 | |
| (min) | (° C.) | (%) | (° C.) | (° C.) | Result | Evaluation | Result | Evaluation | Result | Evaluation |
| 0 | 31.4 | 91 | 31.4 | 28.9 | 0.0 | Fair | 0.0 | Fair | 0.0 | Fair |
| 2 | 31.4 | 98 | 31.4 | 29.1 | 0.0 | | 0.0 | | 0.0 | |
| 4 | 31.7 | 100 | 31.7 | 29.5 | 0.0 | | 0.5 | | 0.0 | |
| 6 | 32.2 | 100 | 32.2 | 30.6 | 0.5 | | 0.5 | | 0.0 | |
| 10 | 32.4 | 100 | 32.4 | 30.2 | 1.0 | | 0.5 | | 0.0 | |
| 12 | 32.4 | 99 | 32.4 | 30.1 | 0.5 | | 1.0 | | 0.0 | |
| 16 | 32.8 | 99 | 32.8 | 30.4 | 0.0 | | 1.0 | | 0.5 | |
| 20 | 33.1 | 93 | 31.7 | 30.7 | 0.0 | | 1.5 | | 0.5 | |
| 24 | 33.3 | 92 | 31.8 | 30.8 | 0.0 | | 1.5 | | 1.0 | |

As shown in Table 3, all the circles were photographed during the evaluation and the antifog properties were excellent in Example 1. In Comparative Example 2 and Comparative Example 3, the antifog properties were excellent as in Example 1. In contrast, the antifog properties in Comparative Example 4, Comparative Example 5, and Comparative Example 6 were inferior to those in Example 1, and the antifog properties in Comparative Example 1 were more inferior to those in Example 1.

As described above, the antifouling properties, rubbing resistance, and antifog properties were excellent in Example 1. In Comparative Example 1, although the antifouling properties and the rubbing resistance were excellent, the antifog properties were poor. In Comparative Example 2 and Comparative Example 3, although the antifog properties were excellent, the antifouling properties and the rubbing resistance were poor. In Comparative Example 4, Comparative Example 5, and Comparative Example 6, although the rubbing resistance was excellent, the antifouling properties and the antifog properties were poor.

Another Embodiment

Figure 7:
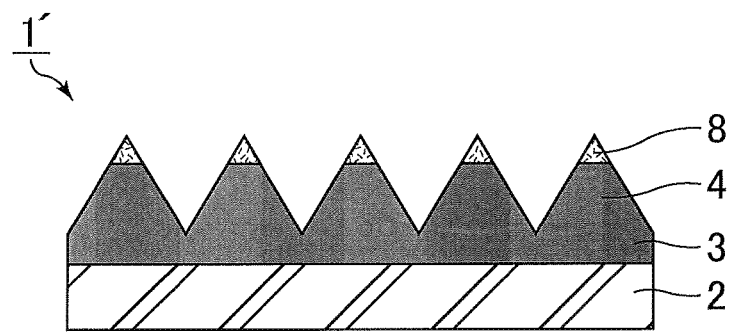
FIG. 7 is a schematic cross-sectional view of an optical member of another embodiment.

In the embodiment described above, the hydrophilic portion at the tip of each projection was obtained by covering the tip with a hydrophilic material. Yet, the hydrophilic portion may be obtained by surface modification of the tip as shown in FIG. 7. FIG. 7 is a schematic cross-sectional view of an optical member of another embodiment. As shown in FIG. 7, an optical member 1' includes the substrate 2 and the cured resin layer 3. In the cured resin layer 3, the tip of each of the projections 4 includes a surface-modified portion 8.

Examples of the method for forming the surface-modified portion 8 include the following methods (1) to (3).

(1) The tip of each of the projections 4 is saponified.

Saponification is performed by, for example, immersing the tip of each projection 4 into an aqueous sodium hydroxide solution. This results in formation of hydrophilic groups such as —OH and —COOH groups on the surface of the tip of each projection 4. Thereby, a hydrophilic portion (surface-modified portion 8) is formed at the tip of each projection 4.

(2) The tip of each of the projections 4 is brought into contact with a hydrophilic material.

Examples of the method for bringing the tip into contact with a hydrophilic material include kneading a hydrophilic material into an adhesive layer to prepare an adhesive member, and bringing the adhesive member into contact with the tip of each projection 4 from the adhesive layer side. Here, if a polymerizable monomer is added to the hydrophilic material, the resulting mixture can be cured (polymerized) by application of active energy rays. Thereby, a hydrophilic portion (surface-modified portion 8) is formed at the tip of each projection 4.

(3) The tip of each of the projections 4 is subjected to plasma etching treatment.

The plasma etching treatment is performed using an inert gas such as argon (Ar) or helium (He), for example. This results in formation of hydrophilic groups such as —OH and —COOH groups on the surface of the tip of each projection 4. Thereby, a hydrophilic portion (surface-modified portion 8) is formed at the tip of each projection 4.

Additional Remarks

Hereinafter, exemplary preferred features of the optical member of the present invention and the production method thereof are described. The exemplary features may appropriately be combined within the spirit of the present invention.

Each of the projections may be formed from a hydrophobic resin and may have its tip covered with a hydrophilic material. This configuration favorably achieves the hydrophilic portions.

The hydrophilic material may contain silicon dioxide. This configuration allows effective use of the hydrophilic material.

The hydrophilic material may have a thickness of 30 nm or smaller. This configuration favorably achieves the state where the hydrophilic material covers the tip of each projection.

Each of the projections may be formed from a hydrophobic resin and may have its tip surface-modified. This configuration favorably achieves the hydrophilic portions.

Hereinafter, an exemplary preferred feature of the method for producing the optical member of the present invention is described.

The film may be formed by plasma deposition. This method efficiently achieves formation of a film of the hydrophilic material.

REFERENCE SIGNS LIST 1, 1', 101: Optical member
2, 102: Substrate
3, 103: Cured resin layer
4, 104: Projection
5: Hydrophilic material
6, 106: Resin composition
7, 107: Die
8: Surface-modified portion
210: Acrylic box
211: Paper
212: Heater
213: Humidifier
214: Glass substrate
215: Camera
P, Q: Pitch
T: Thickness

The invention claimed is:

1. An optical member comprising, on a surface thereof, an uneven structure provided with multiple projections at a pitch not longer than a wavelength of visible light,
   each of the projections being formed from a hydrophobic resin, having its tip covered with a hydrophilic material, and including a hydrophilic portion covered with the hydrophilic material at the tip and a hydrophobic portion where the hydrophobic resin is exposed.

2. The optical member according to claim 1, wherein the hydrophilic material contains silicon dioxide.

3. The optical member according to claim 1, wherein the hydrophilic material has a thickness of 30 nm or smaller.

4. The optical member according to claim 1, wherein each of the projections has a height of 50 nm or greater and 600 nm or smaller.

5. The optical member according to claim 4, wherein each of the projections has a height of 100 nm or greater and 300 nm or smaller.

6. A method for producing the optical member according to claim 1, comprising
   forming a film of the hydrophilic material at the tip of each of the projections.

7. The method for producing the optical member according to claim 6, wherein the film is formed by plasma deposition.

* * * * *